United States Patent
Ito (10) Patent No.: US 9,490,705 B2
(45) Date of Patent: Nov. 8, 2016

(54) INVERTER DEVICE AND AIR CONDITIONER

(71) Applicant: Mitsubishi Electric Corporation, Tokyo (JP)

(72) Inventor: Norikazu Ito, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/612,521

(22) Filed: Feb. 3, 2015

(65) Prior Publication Data

US 2015/0256083 A1    Sep. 10, 2015

(30) Foreign Application Priority Data

Mar. 6, 2014    (JP) .................................. 2014-044286

(51) Int. Cl.
*H02M 1/32* (2007.01)
*H02M 7/5387* (2007.01)
*H02H 7/122* (2006.01)
(Continued)

(52) U.S. Cl.
CPC ........... *H02M 3/335* (2013.01); *H02M 1/4225* (2013.01); *H02M 5/458* (2013.01); *H03K 17/0406* (2013.01); *H03K 17/0412* (2013.01); *H03K 17/163* (2013.01); *H03K 17/168* (2013.01); *Y02B 70/126* (2013.01)

(58) Field of Classification Search
CPC .... H02M 1/08; H02M 1/084; H02M 7/5387; H02M 1/32; H02H 7/1227
USPC .............. 363/34, 37, 56.01–56.09, 126–127; 327/108–110
See application file for complete search history.

(56) References Cited

U.S. PATENT DOCUMENTS 6,049,472 A * 4/2000 Suzuki ................. H02M 1/425
363/37
7,075,355 B2    7/2006 Furuie et al.
(Continued)

FOREIGN PATENT DOCUMENTS

JP    2001-352748 A    12/2001
JP    2002-199700 A    7/2002
(Continued)

OTHER PUBLICATIONS (JP 2007-215385) Gokan Hiroshi, DC Power Supply, Aug. 23, 2007, Mitsubishi Electric Corp.*
(Continued)

*Primary Examiner* — Timothy J Dole
*Assistant Examiner* — Sisay G Tiku
(74) *Attorney, Agent, or Firm* — Posz Law Group, PLC (57) ABSTRACT

An inverter device includes: a rectifier circuit that converts an AC power supply into a DC power supply; a smoothing unit that is connected to a subsequent stage of the rectifier circuit; a short-circuit unit that short-circuits the AC power supply via a reactor that improves a power factor of the AC power supply; an inverter unit that converts a direct current from the smoothing unit into an alternating current; and a control unit that controls the inverter unit, wherein a gate drive circuit is connected to a gate terminal of each switching element in the inverter unit, the gate drive circuit includes a first gate voltage line and a second gate voltage line having a voltage value larger than a voltage value of the first gate voltage line, and the voltage value of the first gate voltage line is variable even during an operation of the inverter device.

19 Claims, 5 Drawing Sheets

(51) Int. Cl.
*H02M 1/08* (2006.01)
*H02M 1/084* (2006.01)
*H02M 3/335* (2006.01)
*H03K 17/04* (2006.01)
*H03K 17/0412* (2006.01)
*H03K 17/16* (2006.01)
*H02M 1/42* (2007.01)
*H02M 5/458* (2006.01)

(56) References Cited

U.S. PATENT DOCUMENTS

| | | | |
|---|---|---|---|
| 7,737,761 B2* | 6/2010 | Ishikawa | H03K 17/567 327/170 |
| 7,973,405 B2 | 7/2011 | Takahashi et al. | |
| 8,410,825 B2* | 4/2013 | Wasekura | H03K 17/14 327/108 |
| 8,558,491 B2 | 10/2013 | Kuwabara et al. | |
| 8,884,560 B2* | 11/2014 | Ito | H02M 5/297 318/400.01 |
| 2005/0052217 A1* | 3/2005 | Furuie | H03K 17/168 327/434 |
| 2009/0066402 A1* | 3/2009 | Hiyama | H03K 17/168 327/392 |
| 2014/0300413 A1* | 10/2014 | Hoyerby | H02M 1/08 330/251 |

FOREIGN PATENT DOCUMENTS

| | | |
|---|---|---|
| JP | 2004-266368 A | 9/2004 |
| JP | 2005-086917 A | 3/2005 |
| JP | 2007-166655 A | 6/2007 |
| JP | 2011120330 * | 6/2011 |
| JP | 2011-135731 A | 7/2011 |
| JP | 2011135731 A * | 7/2011 |
| JP | 5065986 B2 | 8/2012 |
| JP | 2012-200042 A | 10/2012 |
| WO | 2004/073065 A1 | 8/2004 |

OTHER PUBLICATIONS

Machine english translation of "JP 2011135731 A" "Driver of Switching Element" "Jul. 7, 2011".*
Machine english translation of JP 2011120330 Inverter Device and Air Conditioner With the Same.*
Extended European Search Report issued Jun. 29, 2015 in the corresponding European patent application No. 15155231.2.

* cited by examiner

INVERTER DEVICE AND AIR CONDITIONER

BACKGROUND OF THE INVENTION

1. Field of the Invention

The present invention relates to an inverter device and an air conditioner.

2. Description of the Related Art

An inverter device is incorporated in various conventional electric apparatuses (for example, air conditioners). If the turn-on speed of the switching elements included in the inverter device can be changed, it is possible to optimize a trade-off between generated noise and a switching loss according to the magnitude of a load current.

For example, Japanese Patent Application Laid-open No. 2002-199700 discloses a technique of switching the switching speed by switching resistors to be connected to the gate terminals of the switching elements.

However, according to the conventional technique described above, it is required to switch connection to the gate circuits by using switches. For this reason, it is necessary to switch between the circuits while an inverter operation is temporarily stopped or in a very short time during which each switching element is turned off. As a result, there is a problem that it is difficult to realize such switching.

SUMMARY OF THE INVENTION

It is an object of the present invention to at least partially solve the problems in the conventional technology.

According to an aspect of the present invention, an inverter device includes: a rectifier circuit that converts an AC power supply into a DC power supply; a smoothing unit that is connected to a subsequent stage of the rectifier circuit; a short-circuit unit that short-circuits the AC power supply via a reactor that improves a power factor of the AC power supply; an inverter unit that converts a direct current from the smoothing unit into an alternating current; and a control unit that controls the inverter unit, wherein a gate drive circuit is connected to a gate terminal of each switching element in the inverter unit, the gate drive circuit includes a first gate voltage line and a second gate voltage line having a voltage value larger than a voltage value of the first gate voltage line, and the voltage value of the first gate voltage line is variable even during an operation of the inverter device.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of an inverter device according to the present invention will be explained below in detail with reference to the accompanying drawings. The present invention is not limited to the embodiments.

First Embodiment

Figure 1:
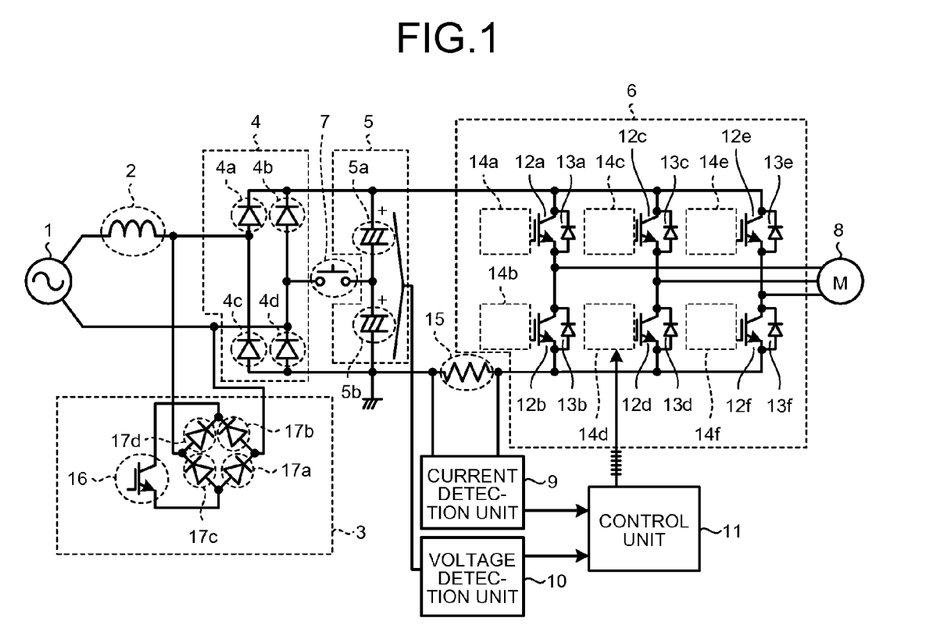
FIG. 1 is a circuit diagram of an example of a configuration of an inverter device according to a first embodiment.

FIG. 1 is a circuit diagram of an example of a configuration of an inverter device according to a first embodiment of the present invention. While the inverter device shown in FIG. 1 is an example of an inverter device that is supplied with a commercial power supply and outputs a desired voltage and a desired frequency, the inverter device according to the present invention is not limited thereto.

The inverter device shown in FIG. 1 uses an AC power supply 1 serving as a single-phase AC power supply and includes a short-circuit unit 3 that short-circuits the AC power supply 1 via a reactor 2 that improves the power factor, a smoothing unit 5 configured from two capacitors 5a and 5b connected in series, and a rectifier circuit 4 that is provided between the short-circuit unit 3 and the smoothing unit 5.

The rectifier circuit 4 includes diodes 4a to 4d and converts the AC power supply 1 into DC power. The short-circuit unit 3 includes a rectifier circuit unit for a short-circuit in which diodes 17a to 17d are connected in a bridge configuration and an IGBT 16 that short-circuits the power supply. When the AC power supply 1 is short-circuited, the direction that the current flows in the short-circuit unit 3 varies depending on the phase. The smoothing unit 5 includes the capacitors 5a and 5b connected in series. A switch 7 is a switch that switches between full-wave rectification and voltage doubler rectification and is connected to one of the outputs of the AC power supply 1 and a point (a median point) between the capacitors 5a and 5b.

The smoothing unit 5 is configured from the two capacitors 5a and 5b. In a case where the potential of the terminal to which the reactor 2 is connected is higher, when the short-circuit switch is off, the capacitor 5a is charged. When the potential of the terminal to which the reactor 2 is connected is lower, the capacitor 5b is charged. Therefore, the voltage to be applied to an inverter unit 6 is twice as high as that when full-wave rectification is performed. When the switch 7 is turned on, a current flows in the short-circuit unit 3. In such a manner, the inverter device shown in FIG. 1 can switch between full-wave rectification and voltage doubler rectification. The smoothing unit 5 is connected to the inverter unit 6 (a three-phase inverter circuit) and the three-phase output of the inverter unit 6 is connected to a motor 8.

A current detection unit 9 detects the current value of a resistor 15, thereby detecting the bus current flowing in the inverter device shown in FIG. 1. A voltage detection unit 10 detects the voltage across both ends of the capacitors 5a and 5b connected in series. The current detection unit 9 and the voltage detection unit 10 each output the detection value to a control unit 11. The control unit 11 controls on and off of six switching elements 12a to 12f in the inverter unit 6, thereby supplying a desired voltage.

The switching elements 12a to 12f are voltage-driven switching elements such as an IGBT (Insulated Gate Bipolar Transistor) and a MOSFET (Metal Oxide Semiconductor Field Effect Transistor). Regenerative diodes 13a to 13f are respectively connected in anti-parallel to the switching elements 12a to 12f. Gate drive circuits 14a to 14f are connected to the gate terminals of the switching elements 12a to 12f, respectively.

Figure 2:
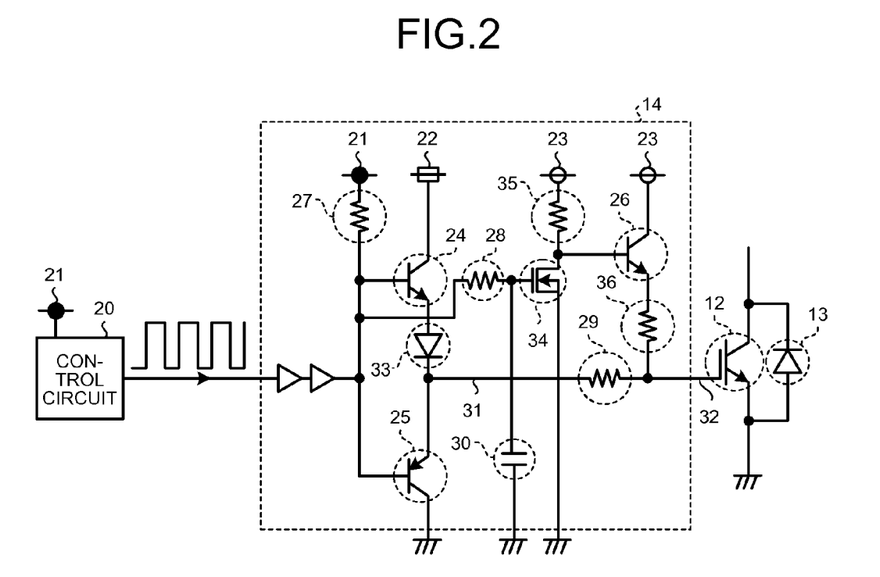
FIG. 2 is a circuit diagram of a configuration of a gate drive circuit in the inverter device according to the first embodiment.

FIG. 2 is a circuit diagram of a configuration of a gate drive circuit in the inverter device according to the first embodiment of the present invention. That is, FIG. 2 is a circuit diagram of the gate drive circuits 14a to 14f (collectively referred to as "gate drive circuit 14") shown in FIG. 1. FIG. 2 shows a control circuit 20, a switching element 12, a diode 13, and the gate drive circuit 14. The switching element 12 is any of the switching elements 12a to 12f shown in FIG. 1, and the diode 13 is any of the diodes 13a to 13f shown in FIG. 1.

The control circuit 20 is a control circuit that outputs a PWM (Pulse Width Modulation) signal for driving the inverter device, and is, for example, a microcomputer. FIG. 2 also shows a DC power supply line 21, a first gate voltage line 22, and a second gate voltage line 23.

The DC power supply line 21 is a power supply line for supplying a DC power supply for operating the control circuit 20. The first gate voltage line 22 is a gate voltage line for driving the gate of the switching element 12. The second gate voltage line 23 is a gate voltage line for driving the gate of the switching element 12. A voltage $V_{cc2}$ of the second gate voltage line 23 is set to be higher than a voltage $V_{cc1}$ of the first gate voltage line 22.

The gate drive circuit 14 includes transistors 24, 25, 26, and 34 (Tr1, Tr2, Tr3, and Tr4), resistors 27, 28, 29, 35, and 36, a capacitor 30, and a diode 33. A resistance value $R_1$ of the resistor 27 and a resistance value $R_2$ of the resistor 28 are set to values that enable the gate drive circuit 14 to operate. The transistor 34 is an nMOS transistor. The capacitor 30 sets a capacitance value $C_1$ such that the product of the resistance value $R_2$ of the resistor 28 and the capacitance value $C_1$ of the capacitor 30 is an appropriate predetermined time constant (that is, 1 to 10 times the turn-on time of a main switching element). The resistor 29 (having a resistance value $R_G$) that is a gate resistor is connected to the gate terminal of the switching element 12 by a node 32, and the resistance value $R_G$ is 2 to 10 times the resistance value of the resistor 36. The gate drive circuit 14 drives one of the switching elements 12.

Next, an operation of the inverter device according to the present embodiment is explained. In the inverter device shown in FIG. 1, when the control circuit 20 outputs an on-signal (high level), the transistor 24 is turned on and the gate terminal of the switching element 12 is charged via the gate resistor 29 by the first gate voltage line 22.

When the gate voltage is equal to or larger than a threshold voltage, the switching element 12 is turned on. The turn-on speed of the switching element 12 is determined by the gate voltage. Accordingly, by controlling the voltage of the first gate voltage line 22, the turn-on speed of the transistor 24 can be adjusted to a desired speed.

Figure 3:
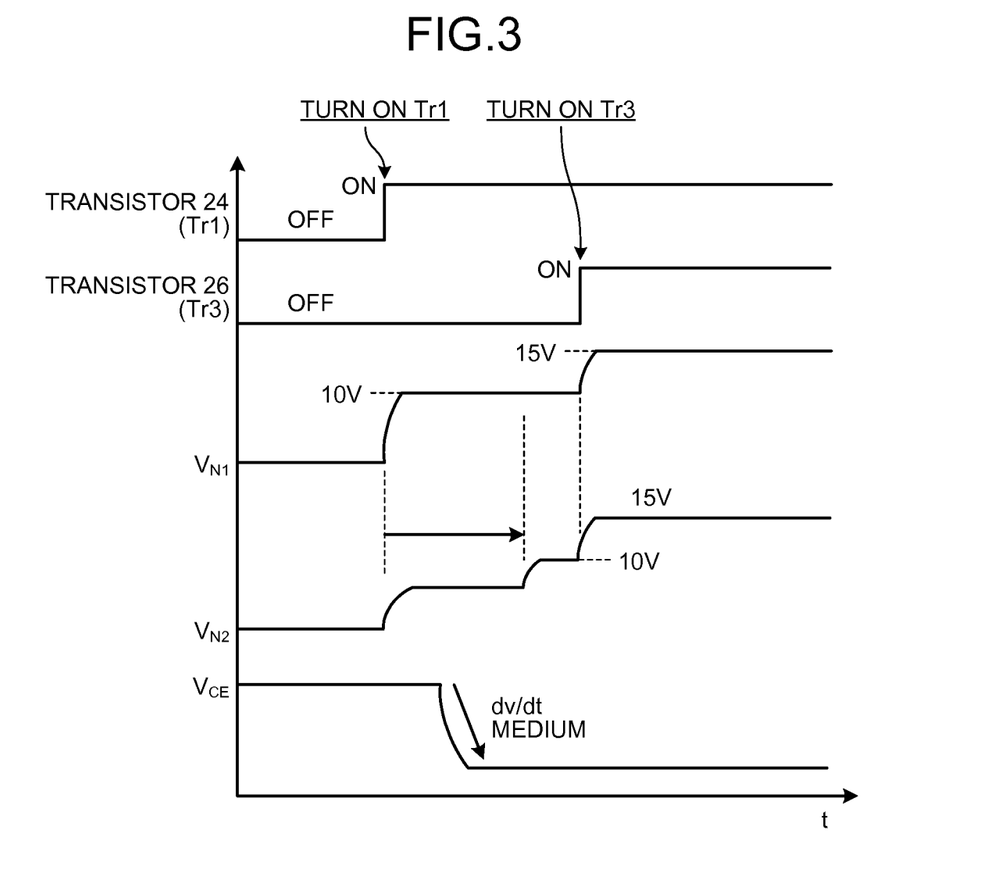
FIG. 3 is a first time chart of on and off of a transistor and a voltage change in the inverter device according to the first embodiment.

Next, when the transistor 26 is turned on, the gate terminal of the switching element 12 is charged by the second gate voltage line 23. At this point, circuit constants R and C are set such that the transistor 26 is turned on after the Miller effect. As explained above, because the voltage of the second gate voltage line 23 is set to be higher than that of the first gate voltage line 22 (for example, 15 volts), although the switching element 12 that has been turned on operates in an activation area for a short time immediately after being turned on, the switching element 12 immediately shifts to a saturation area; therefore, the loss to be generated can be suppressed (see FIG. 3). FIG. 3 is a first time chart of on and off of a transistor and a voltage change in the inverter device according to the present embodiment. FIG. 3 shows timings when the transistor 24 (Tr1) is turned on and when the transistor 26 (Tr3) is turned on, a change in a voltage $V_{N1}$ of a node 31 ($N_1$), a change in a voltage $V_{N2}$ of the node 32 ($N_2$), and a change in a collector-emitter voltage $V_{CE}$ of the switching element 12. The same holds true for FIGS. 4 and 5.

Figure 4:
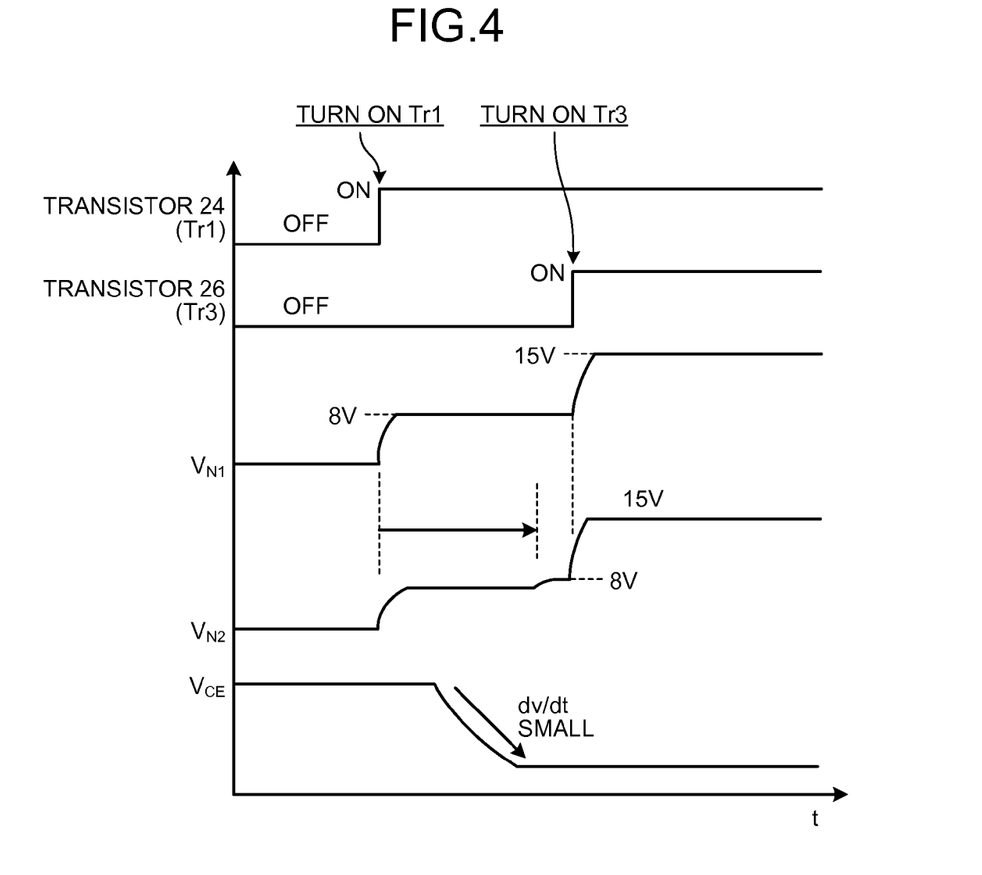
FIG. 4 is a second time chart of on and off of a transistor and a voltage change in the inverter device according to the first embodiment.

If it is necessary to reduce the turn-on speed of the switching element 12, it suffices that the voltage of the first gate voltage line 22 is set to be low (for example, 8 volts). As a result, it is possible to extend the time from when the gate terminal of the switching element 12 starts to be charged to when the voltage reaches a threshold voltage of the switching element 12 and thus the time of the Miller effect is extended; therefore, the turn-on speed can be reduced (see FIG. 4). FIG. 4 is a second time chart of on and off of a transistor and a voltage change in the inverter device according to the present embodiment. If the switching speed (the turn-on speed) is reduced as explained above, the total switching loss generated by the inverter device during switching becomes large; however, high-frequency noise generated by the inverter device can be reduced.

Figure 5:
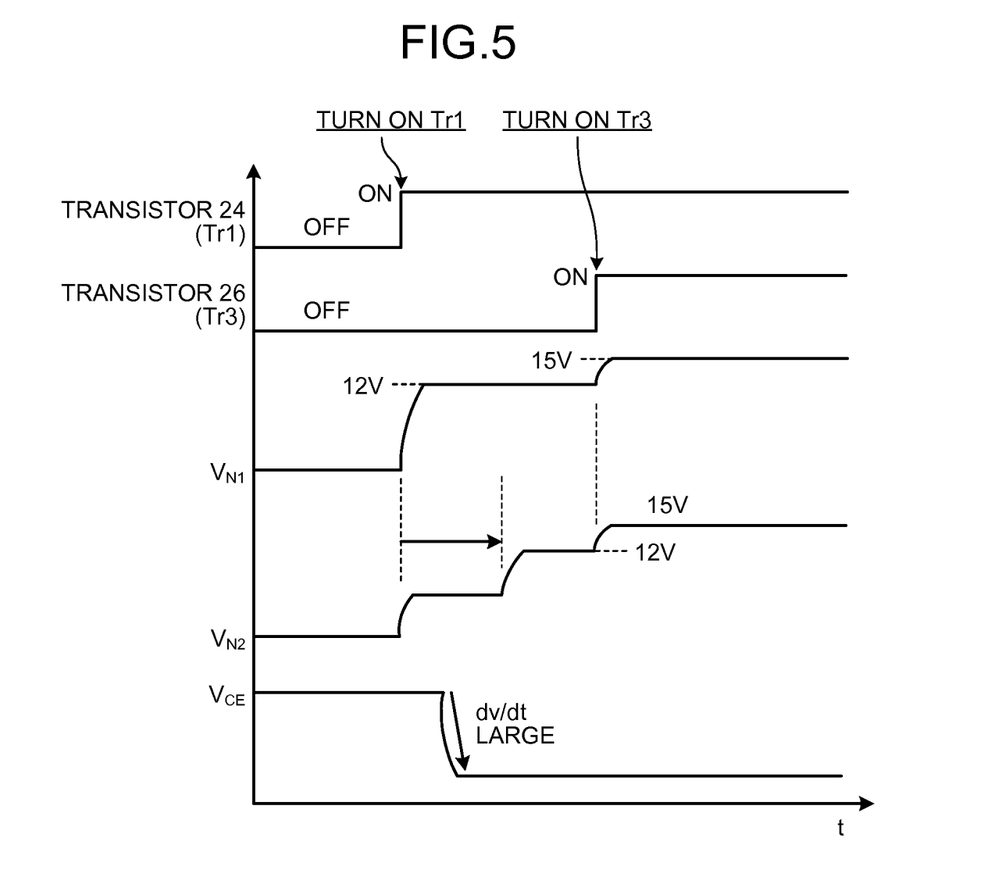
FIG. 5 is a third time chart of on and off of a transistor and a voltage change in the inverter device according to the first embodiment.

In contrast, if it is necessary to increase the turn-on speed, it suffices that the voltage of the first gate voltage line 22 is set to be high (for example, 12 volts). As a result, it is possible to shorten the time from when the gate terminal of the switching element 12 starts to be charged to when the voltage reaches the threshold voltage of the switching element 12 and thus the time of the Miller effect is shortened; therefore, the turn-on speed can be increased (see FIG. 5). FIG. 5 is a third time chart of on and off of a transistor and a voltage change in the inverter device according to the present embodiment. If the switching speed (the turn-on speed) is increased as explained above, high-frequency noise generated by the inverter device during switching becomes large; however, the total switching loss generated by the inverter device can be reduced.

The switching element 12 is turned on in a saturation area by the second gate voltage line 23 except for a short time during which the switching element 12 is turned on from the off state. Even if the voltage of the first gate voltage line 22 is changed during an inverter operation, only the switching time is changed and the driving performance of the switching element 12 is unaffected. Accordingly, it is possible to change the voltage of the first gate voltage line 22 to a desired voltage value without stopping the inverter operation, and thus the switching speed (the turn-on speed) can be changed during the operation of the inverter device.

As explained above, the voltage of the first gate voltage line 22 is set to be variable and the switching speed of the switching element can be changed without stopping the operation of the inverter device. Accordingly, it is possible to drive the inverter while optimizing a trade-off between generated noise and a loss according to the operating state, without stopping an electric apparatus that includes the inverter device. As a result, it is possible to optimally drive an inverter without degrading the ease of use of the electric apparatus.

That is, when the amount of generated noise is large (the inverter-operating current (load current) is large), the maximum amount of noise to be generated can be suppressed by controlling the voltage of the first gate voltage line 22 that is variable to be low so as to reduce the switching speed. When the inverter-operating current (load current) is small, the total switching loss can be suppressed by controlling the voltage of the first gate voltage line 22 that is variable to be high so as to increase the switching speed.

According to the present embodiment, it is possible to provide an inverter device that can change the switching speed without stopping an inverter operation and optimize a trade-off between generated noise and a switching loss according to the magnitude of a load current.

As explained above, by setting the voltage of the first gate voltage line 22 to be variable and controlling the voltage according to the operating state, for example, in an electric apparatus where the ratio of the operating time with a light-load to the overall operating time is large such as an air conditioner, the annual total power consumption can be suppressed and the number of noise suppression components to be incorporated in the electric apparatus can be reduced; therefore, the manufacturing costs can be reduced.

Second Embodiment

Figure 6:
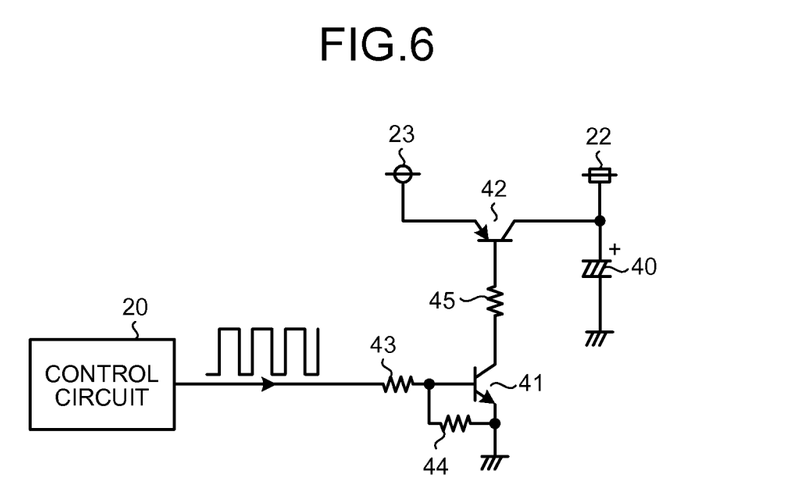
FIG. 6 shows an example of a circuit diagram for generating a voltage of a first gate voltage line (the voltage thereof is variable) in an inverter device according to a second embodiment.

FIG. 6 shows an example of a circuit diagram for generating the voltage of the first gate voltage line 22 in an inverter device according to a second embodiment of the present invention.

The voltage $V_{cc2}$ of the second gate voltage line 23 is set to be higher than the voltage $V_{cc1}$ of the first gate voltage line 22. Electric charge of the voltage $V_{cc2}$ of the second gate voltage line 23 is accumulated in the capacitor 40. A reference potential GND is common to the voltage $V_{cc2}$ of the second gate voltage line 23 and the voltage $V_{cc1}$ of the first gate voltage line 22, and the voltage $V_{cc1}$ of the first gate voltage line 22 is generated by a simple circuit such as a step-down converter. It suffices that the voltage $V_{cc2}$ of the second gate voltage line 23 is higher than the voltage $V_{cc1}$ of the first gate voltage line 22, and the voltage does not have to be the voltage $V_{cc2}$.

In FIG. 6, the resistance values $R_3$, $R_4$, and $R_5$ of respective resistors 43, 44, and 45 are set to appropriate values. When transistors 41 and 42 are turned on and off, the voltage $V_{cc1}$ of the first gate voltage line 22 and the voltage $V_{cc2}$ of the second gate voltage line 23 are generated.

In the inverter device according to the present embodiment, the control circuit 20 monitors the current flowing in the inverter circuit to generate current information and changes the duty ratio of the pulse signal to the transistor 41 on the basis of the current information. Accordingly, the control circuit 20 can control the voltage of the first gate voltage line 22. As explained in the present embodiment, it is possible to control the switching speed by using a circuit with a simple configuration.

Third Embodiment

Figure 7:
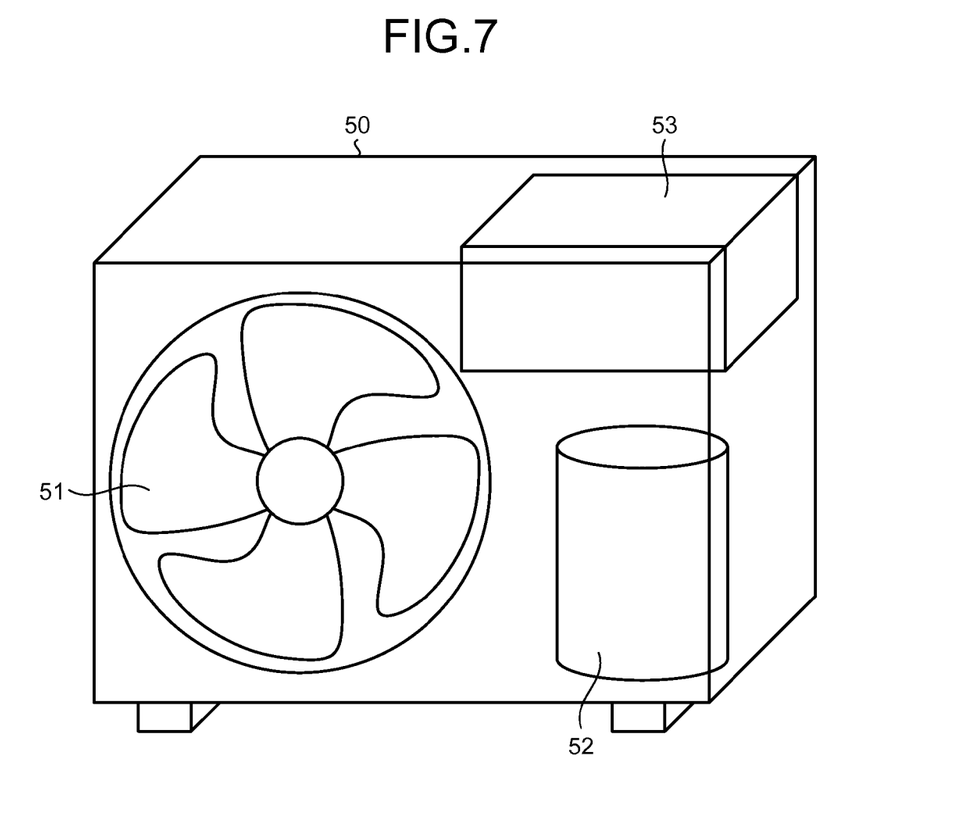
FIG. 7 is a schematic diagram of an outdoor unit of an air conditioner according to a third embodiment of the present invention.

FIG. 7 is a schematic diagram of an outdoor unit of an air conditioner according to the present embodiment. FIG. 7 shows an outdoor unit 50, a fan 51, a compressor 52, and an inverter device 53. The inverter device 53 is the inverter device explained in the first embodiment, arranged in the upper part of the outdoor unit 50, and can control the motor in the compressor 52 (the motor 8 shown in FIG. 1).

As shown in FIG. 7, the inverter device according to the first embodiment can be used in an air conditioner. By using the inverter device according to the first embodiment, an air conditioner that is inexpensive and has high performance can be obtained.

In the inverter device according to the present invention, two gate voltages that have the same reference potential and different voltage values are set, and when the switching element 12 is turned on, the voltages are applied to the gates in order at desired timings. Accordingly, the turn-on speed of the switching element 12 can be controlled without stopping an inverter operation.

According to the present invention, it is possible to provide an inverter device that can change the switching speed without stopping an inverter operation and optimize a trade-off between generated noise and a switching loss according to the magnitude of a load current.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An inverter device comprising:
   a rectifier circuit that converts an AC power supply into a DC power supply;
   a smoothing unit, including two capacitors, connected to a subsequent stage of the rectifier circuit;
   a switch that connects the rectifier circuit to a node located between the two capacitors of the smoothing unit;
   a short-circuit unit that short-circuits the AC power supply via a reactor that improves a power factor of the AC power supply;
   an inverter unit that converts a direct current from the smoothing unit into an alternating current; and
   a control unit including a control circuit configured to control the inverter unit, wherein
   the inverter unit includes a gate drive circuit, the gate drive circuit includes:
      a plurality of switching elements, each of the plurality of switching elements including a gate terminal connected to the gate drive circuit,
      a plurality of resistors including a first resistor and a second resistor,
      a capacitor,
      a first gate voltage line that drives the gate terminal of each of the plurality of switching elements, and
      a second gate voltage line, which drives the gate terminal of each of the plurality of switching elements, the second gate voltage line having a voltage value higher than a voltage value of the first gate voltage line, and the voltage value of the first gate voltage line is variable even during an operation of the inverter device, wherein
      a resistance value of the first resistor and a resistance value of the second resistor are set to values that enable the gate drive circuit to operate.

2. The inverter device according to claim 1, wherein the first gate voltage line is controlled according to a load current.

3. The inverter device according to claim 1, wherein a voltage of the first gate voltage line is generated from the second gate voltage line.

4. An air conditioner comprising the inverter device according to claim 1, wherein the inverter device drives a motor to rotate.

5. The inverter device according to claim 1, further including:
a current detection unit that detects a bus current flowing in the inverter device; and
a voltage detection unit that detects the voltage across both the two capacitors of the smoothing unit, the two capacitors being connected in series, wherein
the current detection unit and the voltage detection unit each output a detected value to the control unit.

6. The inverter device according to claim 5, further comprising
a bus current resistor electrically connected between the smoothing unit and the inverter unit, wherein
the current detection unit is configured to detect the bus current flowing in the inverter device via the bus current resistor.

7. The inverter device according to claim 1, wherein a capacitance value of the capacitor of the gate drive circuit is set such that the product of the resistance value of the second resistor and the capacitance value of the capacitor is a predetermined time constant.

8. The inverter device according to claim 7, wherein the predetermined time constant is greater than a turn-on time of each of the plurality of switching elements of the inverter circuit.

9. The inverter device according to claim 7, wherein the predetermined time constant is about one to ten times greater than a turn-on time of each of the plurality of switching elements of the inverter circuit.

10. The inverter device according to claim 1, wherein
the voltage value of the first gate voltage line is lowered to reduce a turn-on speed of each of the plurality of switching elements of the inverter circuit, and
the voltage value of the first gate voltage line is raised to increase a turn-on speed of each of the plurality of switching elements of the inverter circuit.

11. The inverter device according to claim 1, wherein the controller is configured to vary the voltage value of the first gate voltage line in direct proportion to a load current of the inverter device so that noise generation of the inverter device varies in direct proportion to the load current.

12. The inverter device according to claim 1, wherein the smoothing unit includes only the two capacitors.

13. The inverter device according to claim 1, wherein a voltage of the first gate voltage line is generated from the second gate voltage line.

14. An inverter device comprising:
a rectifier circuit that converts an AC power supply into a DC power supply;
a smoothing unit, including two capacitors, connected to a subsequent stage of the rectifier circuit;
a short-circuit unit that short-circuits the AC power supply via a reactor that improves a power factor of the AC power supply;
an inverter unit that converts a direct current from the smoothing unit into an alternating current; and
a control unit including a control circuit configured to control the inverter unit, wherein
the inverter unit includes a gate drive circuit, the gate drive circuit includes:
a plurality of switching elements, each of the plurality of switching elements including a gate terminal connected to the gate drive circuit,
a plurality of resistors including a first resistor and a second resistor,
a capacitor,
a first gate voltage line that drives the gate terminal of each of the plurality of switching elements, and
a second gate voltage line, which drives the gate terminal of each of the plurality of switching elements, the second gate voltage line having a voltage value higher than a voltage value of the first gate voltage line, and the voltage value of the first gate voltage line is variable even during an operation of the inverter device, wherein
a resistance value of the first resistor and a resistance value of the second resistor are set to values that enable the gate drive circuit to operate, and
a capacitance value of the capacitor of the gate drive circuit is set such that the product of the resistance value of the second resistor and the capacitance value of the capacitor is a predetermined time constant.

15. The inverter device according to claim 14, wherein the first gate voltage line is controlled according to a load current.

16. An air conditioner comprising the inverter device according to claim 14, wherein the inverter device drives a motor to rotate.

17. The inverter device according to claim 14, further including:
a current detection unit that detects a bus current flowing in the inverter device; and
a voltage detection unit that detects the voltage across both the two capacitors of the smoothing unit, the two capacitors being connected in series, wherein
the current detection unit and the voltage detection unit each output a detected value to the control unit.

18. The inverter device according to claim 17, further comprising
a bus current resistor electrically connected between the smoothing unit and the inverter unit, wherein
the current detection unit is configured to detect the bus current flowing in the inverter device via the bus current resistor.

19. The inverter device according to claim 14, wherein the predetermined time constant is greater than a turn-on time of each of the plurality of switching elements of the inverter circuit.

* * * * *